(12) United States Patent
Chang et al.

(10) Patent No.: US 11,115,050 B1
(45) Date of Patent: Sep. 7, 2021

(54) HARDWARE FRIENDLY DATA DECOMPRESSION

(71) Applicant: Innogrit Technologies Co., Ltd., Shanghai (CN)

(72) Inventors: Yuan-Mao Chang, Hsinchu (TW); Jing-Kun Zhong, Huwei (TW)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 17/000,639

(22) Filed: Aug. 24, 2020

(51) Int. Cl.
*H03M 7/00* (2006.01)
*H03M 7/30* (2006.01)
*H04L 29/06* (2006.01)

(52) U.S. Cl.
CPC ........... *H03M 7/6005* (2013.01); *H04L 69/04* (2013.01)

(58) Field of Classification Search
CPC ........ H03M 7/6005; H03M 7/42; H03M 7/00; H04L 69/04
USPC ............................................. 341/106, 50, 51
See application file for complete search history.

(56) References Cited

U.S. PATENT DOCUMENTS

| | | | | |
|---|---|---|---|---|
| 5,272,478 A * | 12/1993 | Allen | ....................... | G06T 9/005 341/107 |
| 5,363,099 A * | 11/1994 | Allen | ....................... | G06T 9/005 341/107 |
| 5,475,388 A * | 12/1995 | Gormish | ................. | G06T 9/005 341/106 |
| 5,912,636 A * | 6/1999 | Gormish | ................. | G06T 9/005 341/50 |
| 8,811,611 B2 * | 8/2014 | Teerlink | .............. | G06F 16/1744 380/44 |
| 9,419,749 B2 * | 8/2016 | Luby | ..................... | H04L 1/0041 |
| 9,660,763 B2 * | 5/2017 | Luby | ..................... | H04L 1/0065 |
| 9,876,607 B2 * | 1/2018 | Luby | ................... | H03M 13/458 |
| 2011/0013777 A1 * | 1/2011 | Teerlink | .............. | G06F 16/1744 380/286 |

(Continued)

OTHER PUBLICATIONS

Asymmetric numeral systems, Jarek Duda, arXiv:0902.0271v5 [cs.IT], May 21, 2009.

(Continued)

*Primary Examiner* — Jean B Jeanglaude
(74) *Attorney, Agent, or Firm* — IPro, PLLC; Xiaomin Huang

(57) ABSTRACT

Systems, apparatus and methods are provided for decompressing compressed data. A method may include receiving encoded data to be decompressed, obtaining a "$S_{total}$" of a total number of symbols, numbers of occurrences for distinct symbols in the encoded data, and a final state generated during an encoding process as a first state for decoding, building a decoding table containing a row of the distinct symbols, a row of substitutes for numbers of bits to be recovered and a row of substitutes for new states corresponding to encoding states, decoding using the decoding table including: obtaining a current symbol from the decoding table based on a current state X, dynamically determining a current number of bits to be recovered from the encoded data and a new state X based on corresponding substitutes and outputting symbols recovered. L may be a sum of the numbers of occurrences for the distinct symbols.

20 Claims, 7 Drawing Sheets

(56) References Cited

U.S. PATENT DOCUMENTS

2011/0016096 A1* 1/2011 Teerlink .............. G06F 16/1744
707/693
2011/0299629 A1* 12/2011 Luby ................. H03M 13/3761
375/299
2016/0087755 A1* 3/2016 Luby .................... H04L 1/0064
714/776
2017/0033892 A1* 2/2017 Luby .................... H04L 1/0041

OTHER PUBLICATIONS

Asymmetric numeral systems: entropy coding combining speed of Huffman coding with compression rate of arithmetic coding, Jarek Duda, arXiv:1311.2540v2 [cs.IT], Jan. 6, 2014.

* cited by examiner

202

| $s_0$ | $s_1$ | $s_2$ | ..... | $s_{n-1}$ |
|---|---|---|---|---|
| $l_0$ | $l_1$ | $l_2$ | ..... | $l_{n-1}$ |

| $s_0$ | $s_1$ | $s_2$ | ..... | $s_{n-1}$ |
|---|---|---|---|---|
| 0 | $l_0$ | $l_0+l_1$ | ..... | $l_0+l_1+...+l_{n-2}$ |

FIG. 2B

| $C(x,s)$ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| a | 0 | | | | | | | | 1 | | | | | | | |
| b | | 0 | | 2 | 3 | 4 | 5 | 6 | 7 | 8 | 9 | | | | | |
| c | | | | | | | 0 | 1 | | | | | | | 2 | 3 |

FIG. 2C

| 0 | ... | $l_0-1$ | $l_0$ | ... | $l_0+l_1-1$ | ... | $\sum_{i=0}^{n-2} l_i$ | ... | $\sum_{i=0}^{n-1} l_i -1$ |
|---|---|---|---|---|---|---|---|---|---|
| $s_0$ | ... | $s_0$ | $s_1$ | ... | $s_1$ | ... | $s_{n-1}$ | ... | $s_{n-1}$ |
| nBits[0] | ... | nBits[$l_0-1$] | nBits[$l_0$] | ... | nBits[$l_0+l_1-1$] | ... | nBits[$\sum_{i=0}^{n-2} l_i$] | ... | nBits[$\sum_{i=0}^{n-1} l_i -1$] |
| newX[0] | ... | newX[$l_0-1$] | newX[$l_0$] | ... | newX[$l_0+l_1-1$] | ... | newX[$\sum_{i=0}^{n-2} l_i$] | ... | newX[$\sum_{i=0}^{n-1} l_i -1$] |

| 0 | ... | $l_0-1$ | $l_0$ | ... | $l_0+l_1-1$ | ... | $\sum_{i=0}^{n-2} l_i$ | ... | $\sum_{i=0}^{n-1} l_i -1$ |
|---|---|---|---|---|---|---|---|---|---|
| $s_0$ | ... | $s_0$ | $s_1$ | ... | $s_1$ | ... | $s_{n-1}$ | ... | $s_{n-1}$ |

504

FIG. 5B

HARDWARE FRIENDLY DATA DECOMPRESSION

TECHNICAL FIELD

The disclosure herein relates to data compression, particularly relates to lossless compression using entropy encoding.

BACKGROUND

Data compression has been widely used in digital signal systems, such as communication and computing systems. In information theory, Claude Shannon's source coding theorem (or noiseless coding theorem) establishes the limits to possible data compression, and the operational meaning of the Shannon entropy. According to Shannon's source coding theorem, the optimal code length for a symbol is $-\log_b P$, where b is the number of symbols used to make output codes and P is the probability of the input symbol. Two of the most common entropy encoding techniques are Huffman coding and Arithmetic coding. Since 2014, data compressors have started using the Asymmetric Numeral Systems (ANS) family of entropy coding techniques, which allows combination of the compression ratio of Arithmetic coding and a processing cost similar to Huffman coding. These existing ANS implementations, however, are developed for a general-purpose computing system that normally uses a general-purpose Central Processing Unit (CPU) to perform the data compression or decompression operations. Therefore, there is a need for a compression technique that is more hardware friendly, for example, suitable for a Field Programmable Gate Array (FPGA) or an application specific integrated circuit (ASIC).

SUMMARY

The present disclosure provides systems and methods for a lossless compression using entropy encoding. In one exemplary embodiment, there is provided a method that may comprise receiving encoded data to be decompressed; obtaining a size "$S_{total}$" of a total number of symbols in the encoded data, numbers of occurrences for distinct symbols in the encoded data, and a final state generated during an encoding process as a first state for decoding; building a decoding table containing a row of the distinct symbols corresponding to L encoding states, a row of substitutes for numbers of bits to be recovered corresponding to the L encoding states and a row of substitutes for new states corresponding to the L encoding states, in which L may be equal to a sum of the numbers of occurrences for the distinct symbols; decoding the encoded data using the decoding table including: obtaining a current symbol from the decoding table based on a current state X; dynamically determining a current number of bits to be recovered from the encoded data and a new state X based on a corresponding substitute for number of bits to be recovered and a corresponding substitute for a new state from the decoding table for the current state X; and outputting symbols recovered from the encoded data.

In another exemplary embodiment, there is provided a decompressor that may comprise an un-packer configured to receive encoded data to be decompressed and obtain a size "$S_{total}$" of a total number of symbols in the encoded data, numbers of occurrences for distinct symbols in the encoded data, and a final state generated during an encoding process as a first state for decoding; a decoding table constructor configured to build a decoding table containing a row of the distinct symbols corresponding to L encoding states, a row of substitutes for numbers of bits to be recovered corresponding to the L encoding states and a row of substitutes for new states corresponding to the L encoding states, in which L may be equal to a sum of the numbers of occurrences for the distinct symbols; a decoding table storage to store the decoding table; and a decoding engine configured to decode the encoded data using the decoding table including: obtain a current symbol from the decoding table based on a current state X; dynamically determine a current number of bits to be recovered from the encoded data and a new state X based on a corresponding substitute for number of bits to be recovered and a corresponding substitute for a new state from the decoding table for the current state X; and output symbols recovered from the encoded data.

BRIEF DESCRIPTION OF FIGURES

FIG. 2A schematically shows a number of occurrences table in accordance with an embodiment of the present disclosure.

FIG. 2B schematically shows a cumulative number of occurrences table in accordance with an embodiment of the present disclosure.

FIG. 2C schematically shows intervals for the states and symbol state intervals in accordance with an embodiment of the present disclosure.

FIG. 5A schematically shows a decoding table in accordance with an embodiment of the present disclosure.

FIG. 5B schematically shows a decoding table in accordance with another embodiment of the present disclosure.

DETAILED DESCRIPTION

Figure 1:
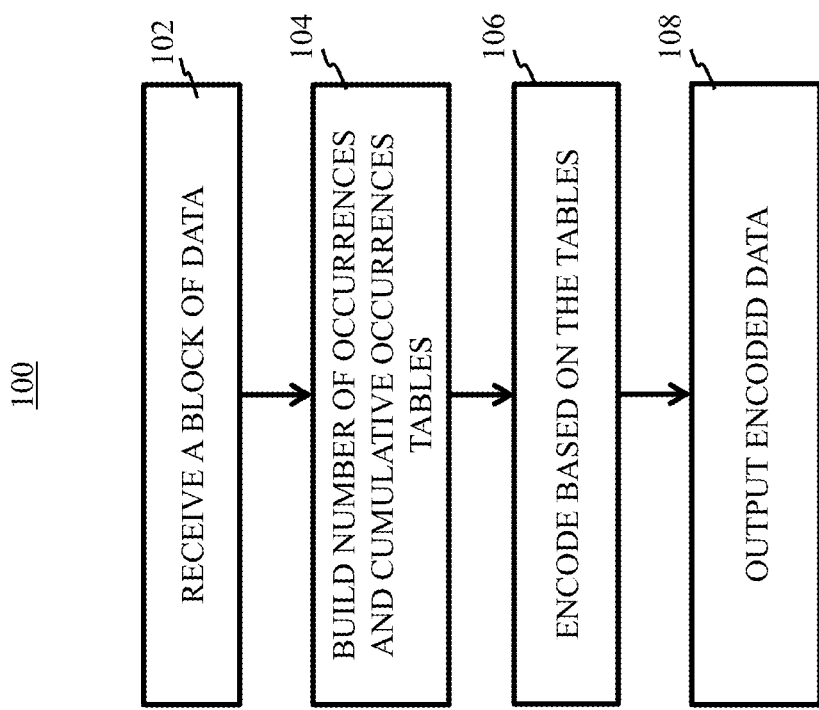
FIG. 1 schematically shows a compression process in accordance with an embodiment of the present disclosure.

Specific embodiments according to the present disclosure will now be described in detail with reference to the accompanying figures. Like elements in the various figures are denoted by like reference numerals for consistency.

FIG. 1 schematically shows a compression process 100 in accordance with an embodiment of the present disclosure. At block 102, a block of input data may be received. In one embodiment, a storage system controller (e.g. SSD controller) may receive a stream of data to be stored in the storage system. In another embodiment, a signal transmitter may receive a stream of data to be transmitted. The stream of data may be compressed using entropy encoding to reduce space used for storage or bandwidth used for transmission. Accordingly, the compression process 100 may also be referred to an encoding process. In some embodiments, the stream of data may be divided into blocks of data and each block of data may be encoded separately. Exemplary sizes of blocks may be 1 KB, 2 KB, 4 KB, etc. For example, one embodiment of compressor may be configured to encode blocks of size of 4 KB and a file with a size larger than 4 KB may be divided into several 4 KB blocks and any leftover in a remainder block smaller than 4 KB. And the blocks of data may be encoded separately.

At block 104, tables used for encoding may be built. In various embodiments, data in the input data block may be represented or organized in distinct data units, for example, 4-bit, 8-bit, 16-bit, etc. The data units may be power of 2 bits in some embodiments, but may not be power of 2 bits in some other embodiments. For example, in one embodiment, data in the input data block may be represented by American Standard Code for Information Interchange (ASCII) code, which is 7-bit. One data unit may be referred to as a symbol and thus the input data block may comprise many symbols. The total number of all symbols in an input data block may be represented as $S_{total}$, which may be 1024, 2048, or 4096 or another number in single digit, double digits, hundreds, thousands or larger. $S_{total}$ may vary for different input streams. Sometimes $S_{total}$ may be a fixed certain number, for example, a number that is power of 2. Some other times $S_{total}$ may not be a fixed certain number and not necessarily power of 2.

In general, a block of data may be formed by a set of distinct symbols with each symbol occurring once or multiple times. In some embodiments, a probability distribution of the symbols may be calculated for the block of input data and two tables may be built to represent the probability distribution of the symbols, a number of occurrences table and a cumulative number of occurrences table.

In one embodiment, the input data may be scanned to build the set of distinct symbols, and also to count the number of distinct symbols and how many times each distinct symbol occurs in the block of input data. In various embodiments, a symbol may have a predefined size, for example, one byte, two bytes, 4 bytes, etc. The size is not necessarily a power of two. As used herein, the set of distinct symbols may also be referred to as an alphabet (A), each symbol may also be referred to as an element and represented using the lower-case letter "s." The lower-case letter "n" may be used to represent the number of distinct symbols (or elements) in the alphabet with n being an integer larger than one. It should be noted that in some embodiments, the set of distinct symbols may be predetermined, for example, pre-programmed or given by a specification. In such embodiments, the input data may be scanned to just count the number of distinct symbols and how many times each distinct symbol occurs in the block of input data.

The number of occurrences for an element "s" may be denoted using the italicized lower-case letter "$l$" and subscript "s" as "$l_s$," and the total occurrences of all symbols in the block may be represented as "L"

$$\left(\text{with } L = \sum_{i=0}^{n-1} l_i\right).$$

The probability of occurrence for one element may be calculated by dividing a number of occurrences for the element by the total occurrences of all symbols in the block. That is, the probability of element "s" in the block of symbols is $l_s/L$. The number of occurrences for an element representing an actual number of occurrences for the element may be referred to as "$l_{s\text{-}actual}$" and may be obtained, for example, by counting how many times the element occurs in the block of input data. The total occurrences of all symbols in the block obtained by summing the actual numbers of occurrences for all distinct symbols may be referred to as the actual total occurrences of all symbols, or "$L_{actual}$". The probability of element "s" in the block of symbols $l_{s\text{-}actual}/L_{actual}$ may be referred to as an actual probability. It should be noted that the number $L_{actual}$ is equal to $S_{total}$.

In various embodiments, the actual symbol probability distribution may be processed to reduce the number of total occurrences of all symbols. The process may be referred to as a L reduction process or simply reduction. For example, after obtaining (e.g., by counting) the number of occurrences "$l_{s\text{-}actual}$" for an element, this actual number of occurrences may be reduced to generate a reduced number of occurrences "$l_{s\text{-}reduced}$" by dividing "$l_{s\text{-}actual}$" with a predetermined number DIV and round the division result to a non-zero whole number. There may be different approaches to obtain the non-zero whole number. In one embodiment, the non-zero whole number may be obtained by rounding up the division result to the nearest whole number using a ceiling function, for example, ceiling($l_{s\text{-}actual}$/DIV). In another embodiment, the non-zero whole number may be obtained by rounding down the division result to the nearest whole number using a floor function, for example, floor($l_{s\text{-}actual}$/DIV), and if the result of the floor function is zero, the non-zero whole number may be set as one. That is, the non-zero whole number may be floor($l_{s\text{-}actual}$/DIV)+1 if $l_{s\text{-}actual}$ is less than DIV. In yet another embodiment, the non-zero whole number may be obtained by rounding the division result to the closest whole number (e.g., rounding up if the reminder is equal to or greater than 0.5 and rounding down if the reminder is less than 0.5), and if the result by rounding is zero, set the result to one.

The predetermined number DIV may be any number larger than one and a typical example number may be a positive integer such as, but not limited to, 2, 3, or 4, etc. The same predetermined number may be used to reduce the number of occurrences for each distinct symbol in the input block of data. After the reduction in each individual number of occurrences for each distinct symbol, the number of total occurrences of all symbols may also be reduced to a reduced number of total occurrences of all symbols, which may be represented as "$L_{reduced}$." It should be noted that $L_{reduced}$ may be close to $L_{actual}$/DIV but not necessarily equal.

As an example, suppose a symbol "α" appeared five (5) times in a block of 4096 symbols and a symbol "β" appeared three (3) times in the same block. There may be other symbols in the same block with a total number of occurrences of 4088 (4096−8). The symbol "α" may have an actual number of occurrences of 5 and actual probability of occurrences of 5/4096. The symbol "β" may have an actual number of occurrences of 3 and actual probability of occurrences of 3/4096. In an embodiment, the ceiling function may be used to obtain the reduced number of occurrences, with an example DIV being 4, for symbol "α" the "$l_{s\text{-}reduced}$" may be obtained by ceiling($l_{s\text{-}actual}$/DIV), which is equal to two (2) and for symbol "β" the "$l_{s\text{-}reduced}$" may be obtained by ceiling($l_{s\text{-}actual}$/DIV), which is equal to one (1). In another embodiment, the floor function may be used to obtain the reduced number of occurrences, still with an example DIV being 4, for symbol "α" the "$l_{s\text{-}reduced}$" may be obtained by floor($l_{s\text{-}actual}$/DIV), which is equal to one (1); and for symbol "β", because $l_{s\text{-}actual}$ is less than DIV, the "$l_{s\text{-}reduced}$" may be obtained by floor($l_{s\text{-}actual}$/DIV)+1, which is also equal to one (1). In both cases, after L reduction, the reduced total number of occurrences for all symbols may be $$L_{reduced} = \sum_{i=0}^{n-1} l_{i\text{-}reduced},$$

which may be equal to 1024 (4096/4), or close to 1024 but not equal to 1024 (e.g., larger or smaller than 1024).

In various embodiments, the probability distribution used for compression or decompression may be the actual probability distribution or a probability distribution after a L reduction and the compression is lossless in both cases. It should be noted that an embodiment may obtain the best compression ratio with the actual probability distribution. Using a probability distribution after a L reduction may improve speed and reduce hardware cost (e.g., storage space) but may sacrifice a little on compression ratio. Because the compression and decompression techniques according to the present disclosure may be implemented using either actual probability distribution or a probability distribution after a L reduction, the term "$l_s$" may be used as a generic term for number of occurrences for an element "s", which may be the actual number of occurrences for an element "s" or a reduced number of occurrences for the element "s". And, the term "L" may be used as a generic term for the number of total occurrences of all symbols in a block of data, which may be the actual number of total occurrences of all symbols in a block of data or a reduced number of total occurrences of all symbols in a block of data.

An example with L being 8 and an alphabet having three elements may be used to illustrate the compression and decompression operations according to an embodiment. The three elements alphabet may be represented as {a, b, c} with "a", "b", "c" representing three distinct symbols. In this example, assuming that the number of occurrences for element "a" is one (1), the number of occurrences for element "b" is five (5) and the number of occurrences for element "c" is two (2), the probability of occurrence for element "a" may be 1/8, the probability of occurrence for element "b" may be 5/8 and the probability of occurrence for element "c" may be 2/8. In the example, the letters "a," "b" and "c" may be used to represent any three different distinct symbols, not necessarily the letters themselves. It should be noted that each element a, b or c may have a predefined size that may be different in different embodiments because different embodiments may use different codes for the elements. For example, the predefined size for an element may be 7 bits in ASCII, 8 bits in extended ASCII, or 32 bits in UTF-32.

FIG. 2A schematically shows a number of occurrences table 202 in accordance with an embodiment of the present disclosure. The number of occurrences table 202 may be a table of number of occurrences for all elements of the symbol set and may be referred to as the $l_s$ table. For each symbol $s_i$ (with the subscript "i" from 0 to n−1), its number of occurrences is $l_i$ may be stored. It should be noted that the first row of elements is shown in table 202 for illustration. In some embodiments, the position of each number of occurrences in the second row may correspond to the position of the corresponding symbol in the symbol set and thus, the table 202 may only need the second row recording the numbers of occurrences of the symbols. For the example of the alphabet being {a, b, c} with three symbols (n=3) the number of occurrences table may be Table 1 below. In one embodiment, the alphabet {a, b, c} may be stored in a symbols table separately during the encoding operation and the list of number of occurrences {1, 5, 2} may be stored as an alternative to the Table 1 with positions of the number of occurrences corresponding to the positions of symbols in the list of symbols in the alphabet.

TABLE 1

Number of occurrences of symbol set {a, b, c} in the simple example

| a | b | c |
|---|---|---|
| 1 | 5 | 2 |

FIG. 2B schematically shows a cumulative number of occurrences table 204 in accordance with an embodiment of the present disclosure. The cumulative number of occurrences table 204 may be a table of cumulative occurrences for all elements of the symbol set. A cumulative occurrence for an element, which may be referred to as $b_s$, is the sum of occurrences of all elements preceding the element in the alphabet. In other words, the cumulative occurrence for one element is a running total of occurrences for elements before this element in the symbol set. The cumulative number of occurrences table 204 may also be referred to as the $b_s$ table. For symbol $s_0$, there is no element preceding the first element, so the cumulative occurrence for symbol so may be zero stored in table 204. For all subsequent symbols $s_i$ (with the subscript "i" from 1 to n−1), their respective cumulative occurrence may be $0+l_0+ \ldots +l_{i+1}$.

It should be noted that the first row of elements is shown in table 204 for illustration. In some embodiments, the position of each cumulative occurrence in the second row may correspond to the position of the corresponding symbol in the symbol set and thus, the table 204 may only need the second row recording the cumulative occurrences for the symbols. For the example of the alphabet being {a, b, c} with three symbols (n=3) the cumulative occurrences table $b_s$ may be Table 2 below. In one embodiment, the alphabet {a, b, c} may be stored separately during the encoding operation and the list of cumulative occurrences {0, 1, 6} may be stored as an alternative to the Table 2 with positions of the cumulative number of occurrences corresponding to the positions of elements in the list of elements in the alphabet.

TABLE 2

Cumulative occurrences of symbol set {a, b, c} in the simple example

| a | b | c |
|---|---|---|
| 0 | 1 | 6 |

In one embodiment, either table 202 or table 204 may have the row of symbols but not both.

Referring back to FIG. 1, at block 106, encoding may be performed based on the number of occurrences and cumulative number of occurrences tables and at block 108, encoded data may be output from a compressor. In one embodiment, the encoding may generate a sequence of numbers with each symbol from the input block of symbols being processed. Each number in the sequence of numbers may represent a state that may be generated based on already processed symbols at that point, and the next number in the sequence may be a function of the current state and the incoming symbol. In some embodiments, the encoding function may be represented as C(x,s), with x being a current state and s being the incoming symbol (e.g., the next symbol to be processed).

It should be noted that a decoding process may work on the encoding generated states in a reversed order. That is, the last encoded symbol may be the first symbol decoded, and the decoding process may start from the last state generated during the compression process 100 and work until the first state generated during the compression process 100. In one embodiment, to get the decoded symbols in the order of input block of symbols, the compression process 100 may start with the last symbol of the input block and work backward until the first symbol of the input block. In another embodiment, the compression process 100 may start with the first symbol of the input block and work forward until the last symbol of the input block, and correspondingly the decoding process may get the last symbol of the input block decoded first and the first symbol of the input block decoded last.

Embodiments according to the present disclosure may need to choose L distinct encoding states for compression. An encoding state may also be referred to as an encoded state or a state. In some embodiments, the L distinct states may be an interval of L different numbers generated during the compression process 100. The interval may be a range for the sequence of numbers. During the compression process 100, when a state generated by the encoding function C(x,s) exceeds the range, some bits of the generated state may be transferred to an output stream (or output buffer) such that the remaining portion of the generated state may fall into the interval. In some embodiments, the generated state may be right shifted to reduce the value of the generated state and the shifted bits may be transferred to the output stream (or output buffer). In various embodiments, the interval for the states may have a span of L, for example, M to M+L−1, in which M may be the base value of the range of states and may be an integer equal to or larger than zero. FIG. 2C schematically shows intervals for the states and symbol state intervals in accordance with an embodiment of the present disclosure. The table shown in FIG. 2C may be an encoding state table for the simple example of {a, b, c} with distribution of {1/8, 5/8, 2/8}. The first row may be states that may be generated during an encoding process. The second row may be numbers of occurrences for encoding symbol "a", the third row may be numbers of occurrences for encoding symbol "b" and the fourth row may be numbers of occurrences for encoding symbol "c". Block 206 may be a selection of 3 to 10 as the L distinct states (e.g., the base value M being 3 for the range of states). In block 206, symbol "a" may have a range of numbers of occurrences of 1 to 1 (e.g., state interval of 1 to 1), symbol "b" may have a range of numbers of occurrences 2 to 4 and 5 to 6 (e.g., state interval of 2 to 6), and symbol "c" may have a range of numbers of occurrences of 0 to 1 (e.g., state interval of 0 to 1).

In at least one embodiment, the range of the states may be chosen as L to 2*L−1 with "L" being the sum of occurrences of all symbols and "*" representing multiplication. In such an embodiment, the base value "M" of the range of the states may be equal to L. Each symbol "s" may also have a symbol state interval $Int_s$ of $l_s$ to $2*l_s-1$. Block 208 may be such a selection with 8 to 15 as the interval for the states (with M being 8 and L also being 8). In block 208, symbol "a" may have a range of numbers of occurrences of 1 to 1 (e.g., state interval of 1 to 1 with $l_s$ being 1), symbol "b" may have a range of numbers of occurrences 5 to 9 (e.g., state interval of 5 to 9 with $l_s$ being 5), and symbol "c" may have a range of numbers of occurrences 2 to 3 (e.g., state interval of 2 to 3 with $l_s$ being 2).

In some embodiments, with M being selected as equal to "L", encoding at block 106 may start with initializing the state "x" to an initial value of "L," then encoding may be performed such that for each symbol in the input data block, based on the number of occurrences table and the cumulative occurrences table, a number of shifts for right-shifting a current state "x" for encoding a current symbol and a next state "x" may be obtained dynamically at runtime. For example, in one embodiment, encoding at block 106 may execute a loop for each symbol of the input block. The loop may work on the symbols from the last symbol to the first symbol of the input block. Inside the loop, the value of "x" may be right shifted until what's left of "x," which may be referred to as $x_{tmp}$, may fall into the symbol state interval for the current symbol. The number of shifts may be referred to as nBits. The next value of state generated by encoding the current symbol "s" may be determined by adding the cumulative occurrence for the current symbol to the $x_{tmp}$ and subtracting the number of occurrences for the current symbol and adding M. That is, the new "x" is equal to $b_s+x_{tmp}-l_s+M$. The nBits of bits being shifted right may be output to the encoded data in block 108.

In one embodiment, the encoding and output operation in block 106 and 108 may be represented in pseudo code as follows, in which "lg( )" is the binary logarithm function, ">>" is the right shift operator, "∈" is the belong to operator:

Initial x=M, R=lg(L);
For the last symbol to the first symbol of the block of symbols to be encoded
   For i=0 to R;
      nBits=i;
      $x_{tmp}$=x>>i;
      until ($x_{tmp}$ ∈$Int_s$) break;
   end
   New x=$b_s+x_{tmp}-l_s$+M;
   Output least significant nBits bits of x (which may be referred to as x[(nBits−1):0])
   to the encoded data
end At the end of the compression process 100, the encoding result may include the encoded data and a final state x. The final state x may be the new state x generated by encoding the last symbol in the input subtracted by M. The encoding result may be output at the block 108.

Block 106 and block 108 may be explained using the simple example symbols set {a, b, c} with "L" being 8, number of occurrences being {1, 5, 2} and cumulative occurrences being {0, 1, 6}. To encode a string "bac", in an embodiment that starts from the last symbol and works until the first symbol, the letter "c" may be encoded first. The initial value "x" may be initialized to 8. The letter "c" may have cumulative occurrences of 6 and number of occurrences of 2. The symbol state interval for "c" may be 2 to 3 (e.g., 2*2−1). The initial x value 8 may be represented in binary as b1000 so it may need to be right shifted twice for the value $x_{tmp}$ to become b10 (e.g., decimal number 2) to fall into the 2 to 3 interval. The new state "x" may become 6+2−2+8, which may be equal to 14. The right shifted two bits b00 may be put into the encoded data.

With the state "x" now being 14, the next letter "a" may be encoded. The letter "a" may have a cumulative occurrence of 0 and number of occurrences of 1. The symbol state interval for "a" may be 1 to 1 (e.g., 2*1−1). The number 14 may be represented in binary as b1110 so it may need to be right shifted three times for the value $x_{tmp}$ to become b1 to fall into the 1 to 1 interval. The new state "x" may become 0+1−1+8, which may equal to 8. The right shifted three bits b110 may be put into the encoded data.

With the state "x" now being 8, the next letter "b" may be encoded. The letter "b" may have a cumulative occurrence of 1 and number of occurrences of 5. The symbol state interval for "b" may be 5 to 9 (e.g., 2*5−1). The number 8 may be represented in binary as b1000 and it may need no shift (zero shift) for the value $x_{tmp}$ to fall into the 5 to 9 interval. The new state "x" may become 1+8−5+8, which may equal to 12. Because "b" may be a last symbol to be encoded, no bits may be put into the encoded data after encoding "b" and a final state x may be obtained by subtracting L from the last generated new state "x" (e.g., 12-8). Therefore, in one embodiment, the encoding result output from a compressor may be encoded data b11000 and a final state x 4.

It should be noted that there is no restriction for the order in which the right shifted bits may be put into the encoded data. That is, a compressor may be configured to put the righted shifted bits into the encoded data in different orders as long as the order information may be preserved such that a decompressor may obtain this information later for decoding. For example, encoding "a" generated three bits b110 being shifted out and put in the encoded data as b110 or b011, and the order information may be preserved for the decompressor to obtain and use for decoding.

Moreover, sets of bits corresponding to consecutive symbols generated in successive encoding operation loops also may be concatenated in any order as long as the concatenation order information may be preserved such that a decompressor may obtain this concatenation information later for decoding. For example, b00 generated by encoding the first element "c" and b110 generated by encoding the second element "b" may be concatenated by b011+b00 as b01100 or b00+b011 as b00011, and the concatenation order information may be preserved for the decompressor to obtain and use for decoding. It at least one embodiment, the bit order, the concatenation order or both may be predetermined (e.g., specified in a specification) and the compressor and decompressor may follow the predetermined orders and thus, in this embodiment, the bit order, the concatenation order or both may not need to be preserved and passed to the decompressor because the decompressor may correctly decode by using the predetermined orders.

Because the compression process 100 may include a loop with a loop index starting from 0 stepping up one by one to lg(L) for each symbol, an embodiment of the compression process 100 with L reduction (smaller L) may take less time to complete the compression than an embodiment of the compression process 100 without L reduction.

Compressor embodiments according to the present disclosure may be friendly to hardware implementations. The number of occurrences table may need n entries (with n being number of distinct symbols of the alphabet) and the cumulative number of occurrences table may also need n entries. The entry size may be lg(L) bits such that the required storage for these two tables may be 2*n*lg(L), in which "*" may be the multiplication operator and "lg( )" may the binary logarithm function. An embodiment with L reduction may also be more hardware friendly than an embodiment without L reduction, because the tables may take less space with smaller entry size (L smaller thus lg(L) smaller). In embodiments in which the bit length of a symbol may be equal to lg(L), the alphabet may be stored together with either table 202 or 204. In embodiments in which the bit length of a symbol is not equal to lg(L), the alphabet may be stored in a separate list and the tables 202 and 204 may only need the second rows in respective tables. It should be noted that encoding techniques according to the present disclosure do not need any encoding tables that contains a list of generated states with each state accompanied by a corresponding symbol (a previous state encoded with this symbol to generate the state). Therefore, compressor embodiments according to the present disclosure may need little storage space, and may be friendly to be implemented in a Field Programmable Gate Array (FPGA) or an Application Specific Integrated Circuit (ASIC), etc.

Figure 3:
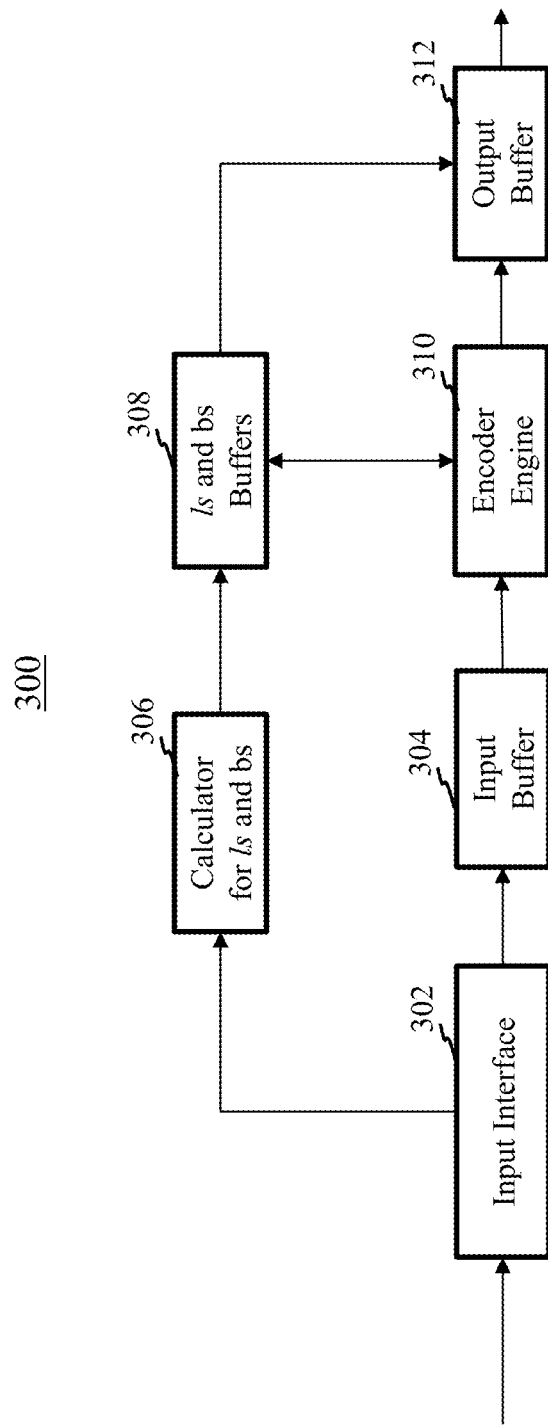
FIG. 3 schematically shows a compressor in accordance with an embodiment of the present disclosure.

FIG. 3 schematically shows a compressor 300 in accordance with an embodiment of the present disclosure. The compressor 300 may be configured to implement the compression process 100. The compressor 300 may comprise an input interface 302, an input buffer 304, a calculator 306, a table buffer 308, an encoder engine 310 and an output buffer 312. The input interface 302 may be coupled to an external bus and configured to perform block 102 to receive data to be encoded. The received data may have one copy stored in the input buffer 304 and another copy sent to the calculator 306. The calculator 306 may be configured to perform block 104 including: scanning the input data to build the alphabet if alphabet is not given, determining the number of occurrences for each symbol in the alphabet and calculating the cumulative occurrences. The table buffer 308 may store the tables generated by the calculator 306, which may include the number of occurrences table 202 and the cumulative occurrences table 204.

In some embodiments, symbols in the alphabet may be represented in an order, for example, extended ASCII code is a list of 256 consecutive numbers that correspond to 256 characters, English characters in lower case are 26 letters from "a" to "z." In such embodiments, the alphabet may be obtained without scanning the input data and there may not be a need to store the alphabet because both encoder and decoder may obtain such information (e.g., the encoding or decoding specification may provide the alphabet) and the address or index of each entry of the table 202 and table 204 may indicate the corresponding symbol. For example, if the alphabet is extended ASCII, the first symbol may be "null" and the first entry in the table 202 may correspond to the number of occurrences for symbol "null" and the first entry in the table 204 may correspond to the cumulative occurrences for symbol "null." In another example, if the alphabet is English letters in lower case, the first symbol may be "a" and the first entry in the table 202 may correspond to the number of occurrences for symbol "a" and the first entry in the table 204 may correspond to the cumulative occurrences for symbol "a."

In some other embodiments, the alphabet may be built by scanning the input data and the distinct symbols in the input data may be unknown before the scan. In such embodiments, the alphabet may be built at runtime and, in one embodiment, it may be stored in a separate table or list in the table buffer 308. In another embodiment, the alphabet may be built at runtime but the list of symbols may be a row in either the table 202 or the table 204 in the table buffer 308 so that there is no need for a separate alphabet table or list.

The encoder engine 310 may be configured to carry out the encoding operation at block 106 using the tables in the table buffer 308 and data in the input buffer 304. The encoded data may be put into the output buffer 312 for the block 108. In some embodiments, the alphabet and number of occurrences may also be put into the output buffer 312. Moreover, in some embodiment, the bit order and concatenation order information for the encoded data may also be output (e.g., to the output stream or into the output buffer).

Figure 4:
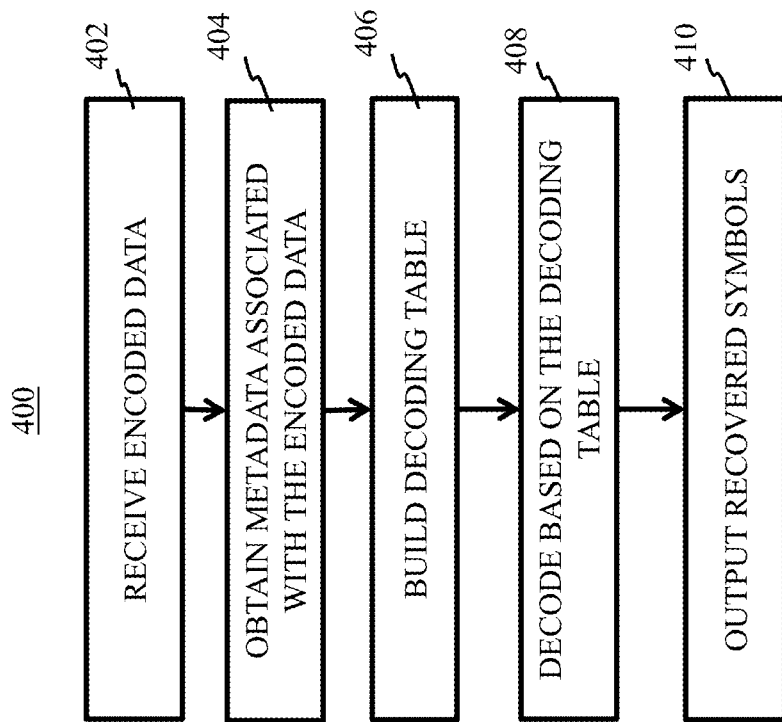
FIG. 4 schematically shows a decompression process in accordance with an embodiment of the present disclosure.

FIG. 4 schematically shows a decompression process 400 in accordance with an embodiment of the present disclosure. In one or more embodiments, the decompression process may also be referred to as a decoding process. At block 402, a block of encoded data may be received. In various embodiments, the block of encoded data may be generated by encoding one block of symbols. It should be noted that one piece of input data (e.g., a phrase, a sentence, a paragraph, a page, a picture or portion of a picture, etc.) may be encoded to generate different encoded data blocks because the alphabet, probability distribution of symbols, or location of the piece of input data in an input data block may be different.

At block 404, metadata associated with the encoded data may be obtained. In embodiments according to the present disclosure, the block of encoded data may have associated metadata. For example, the decompressor may need to know the size of the original data block $S_{total}$, the alphabet, number of occurrences or probability distribution of symbols from which the block of encoded data may be generated, and the final state generated during the encoding process. In one embodiment, the number $S_{total}$ of symbols in the encoded data, the numbers of occurrences for distinct symbols and a final state generated during an encoding process may be obtained by the decoder engine for decoding. It should be noted that the total occurrences of all symbols (regardless of whether it is a reduced L) may be part of information obtained from the number of occurrences, for example, by summing the numbers of occurrences for all distinct symbols. Moreover, in some embodiments the bit order and/or concatenation order may also be included in the metadata to be passed from the compressor to the decompressor. The metadata may be obtained in a variety of ways. For example, the metadata may be stored or transmitted along with the encoded data, or the metadata may be stored or transmitted separately from the encoded data but with identifying information to associate the metadata with specific encoded data.

At block 406, a decoding table may be generated. FIG. 5A schematically shows a decoding table 502 in accordance with an embodiment of the present disclosure. The decoding table 502 may show four rows. The first row may be the L distinct states used for encoding. In some embodiments, the L distinct states may be a range of L distinct values M to M+L−1, with M being the base value of the range. In the embodiment shown in FIG. 5A, the range of states may be zero to L−1 with M being zero. The second row may be the symbols corresponding to the states and may be represented as Symbol[i] with the index i from zero to L−1. The third row may be the number of bits to be recovered from the encoded data corresponding to the states and may be represented as nBits[i] with the index i from zero to L−1. And the fourth row may be new states after the symbol in the column is decoded from the encoded data and may be represented as newX[i] with the index i from zero to L−1. It should be noted that the values in the first row may match zero based indices for the other rows and thus, the first row need not be preserved in the table in at least one embodiment.

In some embodiments, table 502 may be built with two loops: an outer loop to go through all elements of the alphabet and an inner loop to go through all number of occurrences for each element. The decoding table building process may start with initializing the state "X" to an initial value of zero (0) and initializing R to lg(L), then execute the outer loop with a loop index corresponding to the position of each element in the alphabet. In one embodiment, the index may be zero based (starting from zero) so the first element in the alphabet may have an index of zero and the second element in the alphabet may have an index of one, so on and so forth. Inside the outer loop, an initial value of $L_s$ (with a capital letter L and subscript s) may be set to the number of occurrences for the current element such that $L_s=l_s$. The inner loop may start from 1 and work to $l_s$. Inside the inner loop, the current decoded symbol may be set to the current element (e.g., current decoded symbol=current element), the current number of bits to be recovered from the encoded data may be set to R minus floor(lg($L_s$)) (e.g., nBits=R−floor(lg($L_s$))), the new state X may be set to $L_s$ left shift the current number of bits to be recovered minus L (e.g., newX= ($L_s$<<nBits)−L) in which "<<" may be the left shift operator. The current decoded symbol, the current number of bits to be recovered and the new state may be stored into the decoding table for the entry corresponding to the state X. Then for the next inner loop iteration the state X may be incremented by one and the $L_s$ may also be incremented by one. Once the inner loop iterations for all number of occurrences for one element is finished then the outer loop may proceed to the next element in the alphabet.

In one embodiment, the operations to build the decoding table 502 in block 406 may be represented in pseudo code as follows:

Initial X=0, R=lg(L);
For s=0 to n−1
  $L_s=l_s$;
  For i=1 to $l_s$
    Symbol[X]=Element$_s$
    nBits[X]=R−floor(lg($L_s$));
    newX[X]=($L_s$<<nBits[X])−L;
    X incremented by one;
    $L_s$ incremented by one;
  end
end For the example of the alphabet being {a, b, c} with three symbols (n=3) the decoding table 502 may be Table 3 below. It should be noted that the first row may correspond to a zero-based index (the base value M being zero for the range M to M+8−1). Therefore, the first row may be shown for illustration purpose only and does not need to be stored in an embodiment of the decoding table.

TABLE 3

| First exemplary decoding table for symbol set {a, b c} in the simple example | | | | | | | | |
|---|---|---|---|---|---|---|---|---|
| X | 0 | 1 | 2 | 3 | 4 | 5 | 6 | 7 |
| Symbol[X] | a | b | b | b | b | b | c | c |
| nBits[X] | 3 | 1 | 1 | 1 | 0 | 0 | 2 | 2 |
| newX[X] | 0 | 2 | 4 | 6 | 0 | 1 | 0 | 4 |

In some embodiments, when L is not power of 2, the equation nBits=R−floor(lg($L_s$)) is not correct anymore. That is, the decoding table 502 built with the equation nBits=R−floor(lg($L_s$)) may be used when L is power of 2. When L is not power of 2, the symbols row of the decoding table 502 R may be obtained the same way as when L is power of 2 but nBits and newX rows may be filled by a different approach. In one embodiment, when L is not power of 2, in building the decoding table 502, R may be set to ceiling(lg (L)) and a number n_Bits (as a substitute for nBits) may be obtained by executing a loop with an index "j" from 0 to R, and a number new_State (as a substitute for the new state newX) may be set to the current $L_s$. Inside the loop, a temporary $L_s$ referred to as $L_{s\_tmp}$ may be obtained by left-shifting the initial $L_s$ by the loop index number "j", adding the left-shifting obtained value by 2 to the power of j, and subtracting from the obtained value by one. That is, $L_{s\_tmp}=(L_s<<j)+(2^j-1)$, in which "<<" is a left shift operator, "^" is an exponentiation operator. In one embodiment, in a hardware implementation, the operation for ($L_s$<<j)+ (2^j−1) may be performed by shifting $L_s$ "j" bits left and inserting "j" bits 1 at the least significant bit (LSB). The $L_{s\_tmp}$ may be obtained by incrementing the loop index from zero to R each time by one until $L_{s\_tmp}$ falls into the interval {L, . . . , 2L−1}. Then n_Bits may be set to "j" (and saved to the table 502 as a substitute for nBits) and the loop may be stopped.

It should be noted that the number of bits to be recovered from the encoded data may be n_Bits or n_Bits+1, but only the smaller of "j" and "j+1" may be recorded in the decoding table 502. That is, although the number n_Bits may be saved in the table 502 as a substitute for nBits in the situation that L is not power of 2, the number n_Bits is not necessarily the actual number of bits to be recovered from the encoded data, which may be determined dynamically when a decoding operation based on the decoding table 502 is performed.

In one embodiment, the operations to build the decoding table 502 in block 406 for L not being power of 2 may be represented in pseudo code as follows:
Initial X=0, R=ceiling(lg(L));
For s=0 to n−1
$L_s$=$l_s$;
For i=1 to $l_s$
  Symbol[X]=Element$_s$
  Obtain n_Bits[X]:
    for j=0 to R
      $L_{s\_tmp}$=($L_s$<<j)+($2^j$−1);
      until ($L_{s\_tmp}$∈{L, . . . , 2L−1});
      n_Bits[X]=j;
      break;
    end
  new_State[X]=$L_s$;
  X incremented by one;
  $L_s$ incremented by one;
end
end FIG. 5B schematically shows a decoding table 504 in accordance with another embodiment of the present disclosure. The decoding table 504 may show two rows. The first row may be L distinct states used for encoding. In some embodiments, the L distinct states may be a range of L distinct values M to M+L−1, with M being the base value of the range. In the embodiment shown in FIG. 5B, the range of states may be zero to L−1 with M being zero. The second row may be the symbols corresponding to the states and may be represented as Symbol[i] with the index i from zero to L−1. It should be noted that the values in the first row may match zero based indices for the other rows and thus, the first row may be omitted in at least one embodiment. Moreover, in the embodiments implementing decoding table 504, both the current number of bits to be recovered from the encoded data nBits and the new state X newX may be computed at runtime. Therefore, the storage space may be reduced comparing to the embodiments implementing the decoding table 502 and thus the decompressor may need a smaller area in an Integrated Circuit (IC) chip compared to embodiments that build the decoding table 504.

In some embodiments, table 504 may be built with two loops: an outer loop to go through all elements of the alphabet and an inner loop to go through all number of occurrences for each element. The decoding table building process may start with initializing the state "X" to an initial value of zero (0), then execute the outer loop with a loop index corresponding to the position of each element in the alphabet. In one embodiment, the index may be zero based (starting from zero) so the first element in the alphabet may have an index of zero and the second element in the alphabet may have an index of one, so on and so forth. The inner loop may start from 1 and work to $l_s$. Inside the inner loop, the current decoded symbol may be set to the current element (e.g., current decoded symbol=current element). The current decoded symbol may be stored into the decoding table 504 for the entry corresponding to the state X. Then for the next inner loop iteration the state X may be incremented by one. Once the inner loop iterations for all number of occurrences for one element is finished then the outer loop may proceed to the next element in the alphabet.

In one embodiment, the operations to build the decoding table 504 in block 406 may be represented in pseudo code as follows:
Initial X=0;
For s=0 to n−1
For i=1 to $l_s$
  Symbol[X]=Element$_s$
  X incremented by one;
end
end For the example of the alphabet being {a, b, c} with three symbols (n=3) the decoding table 504 may be Table 4 below. It should be noted that the first row may correspond to a zero-based index (the base value M being zero for the range M to M+8−1). Therefore, the first row may be shown for illustration purpose only and does not need to be stored in an embodiment of the decoding table.

TABLE 4

| Second exemplary decoding table for symbol set {a, b, c} in the simple example | | | | | | | |
|---|---|---|---|---|---|---|---|
| X | 0 | 1 | 2 | 3 | 4 | 5 | 6 | 7 |
| Symbol[X] | a | b | b | b | b | b | c | c |

At block 408, decoding based on the decoding table may be performed. The final state in the encoded data may become the first state in the decompression process 400 to be decoded to get the first recovered symbol. In the embodiments that generate the decoding table 502, the final state may be matched to an index of the decoding table 502, the symbol corresponding to the index may be the first recovered symbol. When L is power of 2, the number of bits to be recovered from the encoded data (e.g., nBits) may also be directly obtained from the decoding table 502. The next state X may be obtained by adding the corresponding new state newX in the decoding table 502 to a recovered value represented by the number of bits to be recovered from the encoded data. With the next state X, the next symbol may be obtained, as well as next nBits and newX. Then the decoding operation may continue until all "$S_{total}$" symbols in the encoded data are recovered. It should be noted that some symbols when encoded do not generate right shifted bits and thus there will be no bits to be recovered from those symbols. For example, Table 3 shows that there are two "0" entries in the nBits[X] row. It is possible one or more such symbols may be encoded last to generate the encoded data. Therefore, embodiments of the decompression process 400 may continue even all bits in the encoded data have been processed but the recovered symbols have not reached "$S_{total}$" for a current block of recovered data.

Using Table 3 as an example of the decoding table 502, the encoded data may be b01100 and the first state may be four. It should be noted that the first state in the decompression process may be the last state or final state in the compression process. Because the decompression process may be a separate process, the states described in the decompression process should not be confused with the states in the compression process. The first state may be matched to an index and thus, the first decoded symbol may be Symbol[4], which is "b" as shown in Table 3. Also shown in Table 3, with index being 4, the nBits[4] may be 0 and newX[4] may be 0. Because nBits[4] is zero, there is no bits recovered from the encoded data and recovered value may be zero, so the next state X=0+0=0. Now with state X=0 as the second index, the second decoded symbol may be Symbol[0], which is "a" as shown in Table 3. Also, nBits[0] and newX[0] may be obtained from Table 3 as 3 and 0 respectively. With nBits now being 3, three bits may be recovered from the encoded data. Because the decompressor may obtain the metadata information regarding the bit order and concatenation order, the decompressor may obtain b011 from the decoded data and recognize it as b110, which is decimal 6 in its original order. Accordingly, the next state X=0+6=6. Now with state X=6 as the third index, the third decoded symbol may be Symbol[6], which is "c" as shown in Table 3. Also, nBits[6] and newX[6] may be obtained from Table 3 as 2 and 0 respectively. With nBits now being 2, the last two bits b00 of the encoded data may be recovered from the encoded data.

It should be noted although the decompressor may obtain nBits[6] and newX[6] from Table 3 and continue compute the next state X, because the decompressor has already successfully decoded three symbols "bac", there is no need to do so. Therefore, in at least one embodiment using decoding table 502, during a compression process 100, right shifted bit(s) for encoding the first symbol may not need to be output to the encoded data because these bit(s) may not be needed during the decompression process 400.

In the embodiments that generate the decoding table 504, the final state of encoded data may be matched to an index of the decoding table 504, the symbol corresponding to the index may be the first recovered symbol. However, the decoding table 504 does not have nBits or newX information, so they may be generated dynamically at runtime. That is, embodiments using decoding table 504 may need to obtain a current symbol from the decoding table based on a current state X, and dynamically determining both a current number of bits to be recovered from the encoded data and a new state X at runtime. In one embodiment, the cumulative occurrences table $b_s$ may be needed and it may be generated based on the number of occurrences information (e.g., table $l_s$). In this embodiment, the number of bits to be recovered nBits may be obtained using a Symbol State Value (SSV), for example, nBits=R−floor(lg(SSV)) and the new state X may be equal to [(SSV)<<nBits]−L+(nBits of encoded data), with "<<" being the left shift operator and the value SSV obtained by $b_{s+1}+X-2*b_s$ in which $b_s$ and $b_{s+1}$ may be the cumulative occurrence of the current symbol and next symbol in the alphabet, and "*" may be a multiplication operator. In one embodiment, the number of occurrences table $b_s$ may be built during decoding. In another embodiment, the number of occurrences table $b_s$ may be obtained from the metadata. When a symbol is the last element in the alphabet, there may be a special value $b_{s+1}$ set to L. It should be noted that because $b_{s+1}=b_s+l_s$, the number obtained by the equation $b_{s+1}+X-2*b_s$ is the same as the equation $l_s+X-b_s$. That is, SSV is also equal to $l_s+X-b_s$.

Using Table 4 as an example of the decoding table 504, the encoded data may be b01100 and the first state may be four. The first state may be matched to an index and thus, the first decoded symbol may be Symbol[4], which is "b" as shown in Table 4. As shown in Table 2, for the element "b", the cumulative occurrences $b_s$ may be 1 and the cumulative occurrences $b_{s+1}$ may be 6 so $SSV=(b_{s+1}+X-2*b_s)=$ (6+4−2*1)=8. The nBits may be R−lg8=0 and new state X may be [8<<0]−8+0=0. Now with state X=0 as the second index, the second decoded symbol may be Symbol[0], which is "a" as shown in Table 4. As shown in Table 2, for the element "a", the cumulative occurrences $b_s$ may be 0 and the cumulative occurrences $b_{s+1}$ may be 1 so $SSV=(b_{s+1}+X-2*b_s)=(1+0-2*0)=1$. The nBits may be R−lg1=3. Because the decompressor may obtain the metadata information regarding the bit order and concatenation order, the decompressor may obtain b011 from the decoded data and recognize it as b110, which is decimal 6 in its original order. Accordingly, the new state X may be [1<<3]−8+b110=6. Now with state X=6 as the third index, the third decoded symbol may be Symbol[6], which is "c" as shown in Table 3. As shown in Table 2, for the element "c", the cumulative occurrences $b_s$ may be 6 and because "c" is the last element of the alphabet, the cumulative occurrences $b_{s+1}$ may be $b_n$ (e.g., L=8) so $SSV=(b_{s+1}+X-2*b_s)=(8+6-2*6)=2$. The nBits may be R−lg2=2 and new state X may be [2<<2]−8+ 0=0. With nBits now being 2, the last two bits b00 of the encoded data may be recovered from the encoded data. Similar to the embodiment using the decoding table 3, there is no need to recover the last two bits corresponding the right shifted bit(s) for encoding the first symbol. Therefore, in at least one embodiment using decoding table 504, during a compression process 100, right shifted bit(s) for encoding the first symbol may not need to be output to the encoded data because these bit(s) may not be needed during the decompression process 400.

In some situations, for example, after a L reduction process or an input stream of data has already been compressed by another compression process (e.g., Lempel-Ziv compression), the number L may not be a power of 2. In these situations, the decoding table 502 may still be generated but with a substitute n_Bits for the number of bits to be recovered and a substitute new_State for the new state X stored in the decoding table 502. The decoding table 504 does not contain the number of bits to be recovered or the new state X and may be generated the same way as for L being power of 2, but the substitute n_Bits and substitute new_State may still be generated dynamically. Therefore, for L being not power of 2, the decoding operation at block 408 may need to obtain the number of bits to recover from the encoded data and the next state X from the substitute n_Bits and substitute new_State.

For the embodiments using the decoding table 502, the substitute n_Bits and substitute new_State for a current symbol may be obtained from the decoding table 502. In one embodiment, to determine which one of n_Bits or n_Bits+1 is the correct number of bits to be recovered from encoded data, two X values, one based on n_Bits and another based on n_Bits+1 may be calculated. One of the two X values may fall into the interval of L states (e.g., {0, . . . , L−1} for the base value M being zero) and that one may be the next state X, and the corresponding n_Bits or n_Bits+1 may be the number to the recovered from the encoded data.

The calculation of the actual number of bits to be recovered from the encoded data and next state X from the n_Bits and new_State stored in the table 502 may be represented using the pseudo code as follows, in which "<<" is the left shift operator, "∈" is the belong to operator:

X1=[(new_State)<<n_Bits]−L+(n_Bits of encoded data);
X2=[(new_State)<<(n_Bits−1)]−L+[(n_Bits+1) of encoded data];
If X1∈{0, . . . , L−1}
X=X1; new state X is X1
nBits=n_Bits; the actual number of bits to be recovered from the decoded data is n_Bits
Else
X=X2; new state X is X2
nBits=n_Bits+1; the actual number of bits to be recovered from the decoded
data is n_Bits+1;

For embodiments using the decoding table 504, the substitute n_Bits and substitute new_State may need to be generated dynamically in operations of block 408. First, when L is not power of 2, R may be set to ceiling(lg(L)) both in the encoding process and the decoding process. The encoding process is not affected by setting R=ceiling(lg(L)). In the decoding process, for a current state X, an initial value of $L_s$ may be set to a Symbol State Value (SSV), which may be obtained by $b_{s+1}+X-2*b_s$, or by $l_s+X-b_s$, in which $b_s$ and $b_{s+1}$ may be the cumulative occurrence of the current symbol and next symbol in the alphabet, and "*" may be a multiplication operator. A number n_Bits may be obtained by executing a loop for an index "j" from 0 to R.

Inside the loop, a temporary $L_s$ referred to as $L_{s\_tmp}$ may be obtained by left-shifting the initial $L_s$ by the loop index number "j", adding the left-shifting obtained value by 2 to the power of i, and subtracting from the obtained value by one. That is, $L_{s\_tmp}=(L_s<<j)+(2^j-1)$. In one embodiment, in a hardware implementation, the operation for $(L_s<<j)+(2^j-1)$ may be performed by shifting $L_s$ "j" bits left and inserting "j" bits 1 at the least significant bit (LSB). The $L_{s\_tmp}$ may be obtained by incrementing the loop index from zero to R each time by one until $L_{s\_tmp}$ falls into the interval {L, . . . , 2L−1}. Then n_Bits may be set to "j" and the loop may be stopped. The number of bits to be recovered from the encoded data may be n_Bits or n_Bits+1. In one embodiment, to determine which one of n_Bits or n_Bits+1 is the correct number of bits to be recovered from encoded data, two X values, one based on n_Bits and another based on n_Bits+1 may be calculated. One of the two X values may fall into the interval of L states (e.g., {0, . . . , L−1} for the base value M being zero) and that one may be the next state X, and the corresponding n_Bits or n_Bits+1 may be the number to the recovered from the encoded data.

The calculation of the number of bits to be recovered from the encoded data and next state X may be represented using the pseudo code as follows, in which "<<" is the left shift operator, "∈" is the belong to operator, and "*" is a multiplication operator:

SSV=$b_{s+1}+X-2*b_s$; or alternatively by the equation $l_s+X-b_s$, in which $b_s$ and $b_{s+1}$ may be the cumulative occurrence of the current symbol and next symbol in the alphabet
$L_s$=SSV;
for j=0 to R
$L_{s\_tmp}=(L_s<<j)+(2^j-1)$;
until ($L_{s\_tmp}$∈{L, . . . , 2L−1});
n_Bits=j;
break;
end
X1=[(SSV)<<n_Bits]−L+(n_Bits of encoded data);
X2=[(SSV)<<(n_Bits+1)]−L+[(n_Bits+1) of encoded data];
If X1∈{0, . . . , L−1}
X=X1;
actual number of bits to be recovered from the decoded data nBits is n_Bits;
Else
X=X2;
actual number of bits to be recovered from the decoded data nBits is n_Bits+1;

Therefore, the operation of obtaining n_Bits and determining the nBits and the next state X from n_Bits may be performed either during building of the decoding table 502 (e.g., at block 406) for embodiments that build the decoding table 502 or during the decoding operation (e.g., at block 408) for embodiments that build the decoding table 504.

At block 410, the recovered symbol may be output from the decompressor. In some embodiments, each recovered symbol may be output from the decompressor after it may be decoded. That is, block 410 does not need to wait until all symbols have been decoded to be performed.

Because the decompression process 400 may include a loop with a loop index starting from 1 stepping up one by one to $l_s$ for each symbol, an embodiment of the decompression process 400 with L reduction (smaller $l_s$ for each symbol) may take less time to complete the decompression than an embodiment of the decompression process 400 without L reduction.

Decompressors in embodiments implementing the decoding table 502 and the decoding table 504 may be friendly to hardware implementations. The decoding table 504 may only need storage space for L entries each of lg(n) bits. Although the decoding operation may need the table $b_s$ and value $b_n$, the decompressor may still be implemented with a compact size in an IC chip and thus one embodiment may be referred to as an ultra-small area decompressor. Moreover, although the decoding table 502 may be larger than the decoding table 504, the number of entries for both tables may still be proportional to L, and thus embodiments with L reduction may still be more hardware friendly than embodiments without L reduction. Therefore, decompressor embodiments according to the present disclosure may need little storage space, and may be friendly to be implemented in a Field Programmable Gate Array (FPGA) or an Application Specific Integrated Circuit (ASIC), etc.

Figure 6:
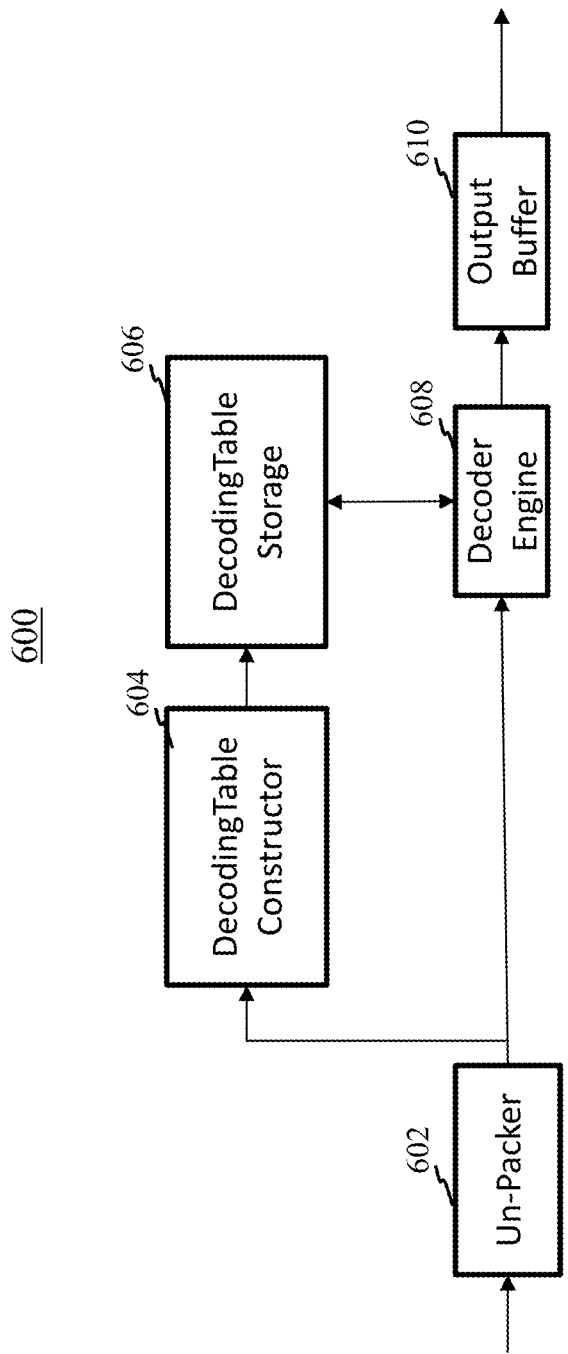
FIG. 6 shows a decompressor in accordance with an embodiment of the present disclosure.

FIG. 6 schematically shows a decompressor 600 in accordance with an embodiment of the present disclosure. The decompressor 600 comprise an un-packer 602, a decoding table constructor 604, a decoding table storage 606, a decoder engine 608 and an output buffer 610. The decompressor 600 may be configured to implement the decompression process 400. The un-packer 602 may be coupled to a data bus and configured to perform block 402 to receive encoded data to be decoded. For example, the data bus may be a bus coupled to a storage device and the encoded data may be received from the storage device. The un-packer 602 may unpack the data received, for example, obtain the encoded data and any metadata associated with the encoded data. The metadata may include, for example, the alphabet, the occurrences of the elements $l_s$. In one embodiment, the size "$S_{total}$" of the total number of symbols in the encoded data may be obtained by the un-packer 602 and L may be obtained by summing the occurrences of the elements $l_s$. And in some embodiments, the metadata may also include, but not limited to, the bit order information, the concatenation order information or both.

The unpacked encoded data and metadata may have one copy passed to the decoding table constructor 604 and another copy passed to the decoder engine 608. The decoding table constructor 604 may be configured to perform block 406 to build the decoding table 502 or 504. In an embodiment that uses the table 504, the decoding table constructor 604 may also be configured to build the cumulative occurrences table $b_s$. The decoding table storage 606 may be a buffer configured to store the decoding table(s) generated by the decoding table constructor 604.

The decoder engine 608 may be configured to carry out the decoding operation at block 408 using the decoding table in the decoding table storage 606 and the encoded data from the un-packer 602. The decoded symbols may be put into the output buffer 610.

In one exemplary embodiment, there is provided a method that may comprise receiving encoded data to be decompressed; obtaining a size "$S_{total}$" of a total number of symbols in the encoded data, numbers of occurrences for distinct symbols in the encoded data, and a final state generated during an encoding process as a first state for decoding; building a decoding table containing a row of the distinct symbols corresponding to L encoding states, a row of substitutes for numbers of bits to be recovered corresponding to the L encoding states and a row of substitutes for new states corresponding to the L encoding states, in which L may be equal to a sum of the numbers of occurrences for the distinct symbols; decoding the encoded data using the decoding table including: obtaining a current symbol from the decoding table based on a current state X; dynamically determining a current number of bits to be recovered from the encoded data and a new state X based on a corresponding substitute for number of bits to be recovered and a corresponding substitute for a new state from the decoding table for the current state X; and outputting symbols recovered from the encoded data.

In one embodiment, the L encoding states may be a range of L distinct values M to M+L−1 with M being a base value for the range and an integer equal to or larger than zero.

In one embodiment, L is not power of 2 and M is zero, and building the decoding table may comprise: setting an initial value X to zero and R to ceiling(lg(L)), in which ceiling( ) is a ceiling function and lg( ) is a binary logarithm function; in an outer loop with a loop index corresponding to positions of each element in a set of the distinct symbols: setting an initial value of $L_s$ to a number of occurrences for a current symbol; in an inner loop to go through all number of occurrences for the current symbol: setting a current entry for the row of distinct symbols to the current symbol; for an index "j" from 0 to R: obtaining a temporary $L_s$ $L_{s\_tmp}$ as ($L_s$<<j)+(2^j−1) until $L_{s\_tmp}$ falls into an interval {L, ..., 2L−1), wherein "<<" is a left shift operator, "^" is an exponentiation operator, and setting a current corresponding substitute for a number of bits to be recovered to "j"; breaking out from the loop with "j" as the index; setting a current corresponding substitute for a new state to Ls; incrementing X by one; incrementing Ls by one; ending the inner loop; and ending the outer loop.

In one embodiment, an operation for ($L_s$<<j)+(2^j−1) may be performed by shifting $L_s$ "j" bits left and inserting "j" bits 1 at the least significant bit (LSB).

In one embodiment, L is not power of 2 and M is zero, and dynamically determining the current number of bits to be recovered from the encoded data and the new state X based on the corresponding substitute for number of bits to be recovered and the corresponding substitute for the new state from the decoding table for the current state X may comprise, with the corresponding substitute for number of bits to be recovered named as n_Bits and the corresponding substitute for the new state named as new_state: taking n_Bits bits and n_Bits+1 bits from the encoded data, appending them to the new_state and subtracting L from the new_state respectively; and determining the current number of bits to be recovered from the encoded data as n_Bits bits or n_Bits+1 bits by which one of them makes their respectively appended new_state falling into the range of L distinct values.

In one embodiment, operations to obtain the current number of bits to be recovered from the encoded data and the new state X may include: setting X1 to [(new_state)<<n_Bits]-L+(n_Bits of the encoded data); setting X2 to [(new_state)<<(n_Bits+1)]-L+[(n_Bits+1) of the encoded data]; determining which of X1 and X2 falls into a range of {0, ..., L−1}; setting the current number of bits to be recovered from the encoded data as n_Bits and the new state X to X1 if X1 falls into the range of {0, ..., L−1}; and setting the current number of bits to be recovered from the encoded data as n_Bits+1 and the new state X to X2 if X2 falls into the range of {0, ..., L−1}.

In one embodiment, the method may further comprise, obtaining a bit order and a concatenation order from metadata associated with the encoded data, the bit order specifying an order of bits when the encoded data is generated and the concatenation order specifying an order for sets of bits generated from consecutive symbols being concatenated together when the encoded data is generated.

In one embodiment, the method may further comprise, obtaining the number L from metadata associated with the encoded data.

In one embodiment, the method may further comprise, after decoding a last symbol from the encoded data, skipping dynamically determining a current number of bits to be recovered from the encoded data and a new state X.

In one embodiment, the numbers of occurrences for the distinct symbols may be reduced numbers of occurrences instead of actual numbers of occurrences.

In another exemplary embodiment, there is provided a decompressor that may comprise an un-packer configured to receive encoded data to be decompressed and obtain a size "$S_{total}$" of a total number of symbols in the encoded data, numbers of occurrences for distinct symbols in the encoded data, and a final state generated during an encoding process as a first state for decoding; a decoding table constructor configured to build a decoding table containing a row of the distinct symbols corresponding to L encoding states, a row of substitutes for numbers of bits to be recovered corresponding to the L encoding states and a row of substitutes for new states corresponding to the L encoding states, in which L may be equal to a sum of the numbers of occurrences for the distinct symbols; a decoding table storage to store the decoding table; and a decoding engine configured to decode the encoded data using the decoding table including: obtain a current symbol from the decoding table based on a current state X; dynamically determine a current number of bits to be recovered from the encoded data and a new state X based on a corresponding substitute for number of bits to be recovered and a corresponding substitute for a new state from the decoding table for the current state X; and output symbols recovered from the encoded data.

In one embodiment, the L encoding states may be a range of L distinct values M to M+L−1 with M being a base value for the range and an integer equal to or larger than zero.

In one embodiment, L is not power of 2 and M is zero, and to build the decoding table may comprise: set an initial value X to zero and R to ceiling(lg(L)), in which ceiling( ) is a ceiling function and lg( ) is a binary logarithm function; in an outer loop with a loop index corresponding to positions of each element in a set of the distinct symbols: set an initial value of $L_s$ to a number of occurrences for a current symbol; in an inner loop to go through all number of occurrences for the current symbol: set a current entry for the row of distinct symbols to the current symbol; for an index "j" from 0 to R: obtain a temporary $L_s$ $L_{s\_tmp}$ as ($L_s$<<j)+(2^j−1) until $L_{s\_tmp}$ falls into an interval {L, ..., 2L−1), in which "<<" is a left shift operator, "^" is an exponentiation operator, and set a current corresponding substitute for a number of bits to be recovered to "j"; break out from the loop with "j" as the index; set a current corresponding substitute for a new state to Ls; increment X by one; increment Ls by one; end the inner loop; and end the outer loop.

In one embodiment, an operation for $(L_s<<j)+(2^j-1)$ may be performed by shifting $L_s$ "j" bits left and inserting "j" bits 1 at the least significant bit (LSB).

In one embodiment, L is not power of 2 and M is zero, and to dynamically determine the current number of bits to be recovered from the encoded data and the new state X based on the corresponding substitute for number of bits to be recovered and the corresponding substitute for the new state from the decoding table for the current state X may comprise, with the corresponding substitute for number of bits to be recovered named as n_Bits and the corresponding substitute for the new state named as new_state: take n_Bits bits and n_Bits+1 bits from the encoded data, append them to the new_state and subtract L from the new_state respectively; and determine the current number of bits to be recovered from the encoded data as n_Bits bits or n_Bits+1 bits by which one of them makes their respectively appended new_state falling into the range of L distinct values.

In one embodiment, operations to obtain the current number of bits to be recovered from the encoded data and the new state X may include: setting X1 to [(new_state) <<n_Bits]−L+(n_Bits of the encoded data); setting X2 to [(new_state)<<(n_Bits+1)]−L+[(n_Bits+1) of the encoded data]; determining which of X1 and X2 falls into a range of {0, . . . , L−1}; setting the current number of bits to be recovered from the encoded data as n_Bits and the new state X to X1 if X1 falls into the range of {0, . . . , L−1}; and setting the current number of bits to be recovered from the encoded data as n_Bits+1 and the new state X to X2 if X2 falls into the range of {, . . . , L−1}.

In one embodiment, the un-packer may be further configured to obtain a bit order and a concatenation order from metadata associated with the encoded data, the bit order specifying an order of bits when the encoded data is generated and the concatenation order specifying an order for sets of bits generated from consecutive symbols being concatenated together when the encoded data is generated.

In one embodiment, the un-packer may be further configured to obtain the number L from metadata associated with the encoded data.

In one embodiment, the decoding engine may be further configured to, after decoding a last symbol from the encoded data, skip dynamically determining a current number of bits to be recovered from the encoded data and a new state X.

In one embodiment, the numbers of occurrences for the distinct symbols may be reduced numbers of occurrences instead of actual numbers of occurrences.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as Dynamic Random Access Memory (DRAM) or Static Random Access Memory (SRAM)), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
    receiving encoded data to be decompressed;
    obtaining a size "$S_{total}$" of a total number of symbols in the encoded data, numbers of occurrences for distinct symbols in the encoded data, and a final state generated during an encoding process as a first state for decoding;
    building a decoding table containing a row of the distinct symbols corresponding to L encoding states, a row of substitutes for numbers of bits to be recovered corresponding to the L encoding states and a row of substitutes for new states corresponding to the L encoding states, wherein L is equal to a sum of the numbers of occurrences for the distinct symbols;
    decoding the encoded data using the decoding table including:
        obtaining a current symbol from the decoding table based on a current state X;
        dynamically determining a current number of bits to be recovered from the encoded data and a new state X based on a corresponding substitute for number of bits to be recovered and a corresponding substitute for a new state from the decoding table for the current state X; and
    outputting symbols recovered from the encoded data.

2. The method of claim 1, wherein the L encoding states are a range of L distinct values M to M+L−1 with M being a base value for the range and an integer equal to or larger than zero.

3. The method of claim 2, wherein L is not power of 2 and M is zero, and building the decoding table comprises:
    setting an initial value X to zero and R to ceiling(lg(L)), wherein ceiling( ) is a ceiling function and lg( ) is a binary logarithm function;
    in an outer loop with a loop index corresponding to positions of each element in a set of the distinct symbols:
        setting an initial value of $L_s$ to a number of occurrences for a current symbol;
        in an inner loop to go through all number of occurrences for the current symbol:
            setting a current entry for the row of distinct symbols to the current symbol;
            for an index "j" from 0 to R:
                obtaining a temporary $L_s$ $L_{s\_tmp}$ as $(L_s<<j)+(2^j-1)$ until $L_{s\_tmp}$ falls into an interval {L, . . . , 2L−1), wherein "<<" is a left shift operator, "^" is an exponentiation operator, and setting a current corresponding substitute for a number of bits to be recovered to "j";
                breaking out from the loop with "j" as the index;
            setting a current corresponding substitute for a new state to Ls;
            incrementing X by one;
            incrementing Ls by one;
        ending the inner loop; and
    ending the outer loop.

4. The method of claim 3, wherein an operation for $(L_s<<j)+(2^j-1)$ is performed by shifting $L_s$ "j" bits left and inserting "j" bits 1 at the least significant bit (LSB).

5. The method of claim 2, wherein L is not power of 2 and M is zero, and dynamically determining the current number of bits to be recovered from the encoded data and the new state X based on the corresponding substitute for number of bits to be recovered and the corresponding substitute for the new state from the decoding table for the current state X comprises, with the corresponding substitute for number of bits to be recovered named as n_Bits and the corresponding substitute for the new state named as new_state:
   taking n_Bits bits and n_Bits+1 bits from the encoded data, appending them to the new_state and subtracting L from the new_state respectively; and
   determining the current number of bits to be recovered from the encoded data as n_Bits bits or n_Bits+1 bits by which one of them makes their respectively appended new_state falling into the range of L distinct values.

6. The method of claim 5, wherein operations to obtain the current number of bits to be recovered from the encoded data and the new state X include:
   setting X1 to [(new_state)<<n_Bits]−L+(n_Bits of the encoded data);
   setting X2 to [(new_state)<<(n_Bits+1)]−L+[(n_Bits+1) of the encoded data];
   determining which of X1 and X2 falls into a range of $\{0, \ldots, L-1\}$;
   setting the current number of bits to be recovered from the encoded data as n_Bits and the new state X to X1 if X1 falls into the range of $\{0, \ldots, L-1\}$; and
   setting the current number of bits to be recovered from the encoded data as n_Bits+1 and the new state X to X2 if X2 falls into the range of $\{0, \ldots, L-1\}$.

7. The method of claim 1, further comprising obtaining a bit order and a concatenation order from metadata associated with the encoded data, the bit order specifying an order of bits when the encoded data is generated and the concatenation order specifying an order for sets of bits generated from consecutive symbols being concatenated together when the encoded data is generated.

8. The method of claim 1, further comprising obtaining the number L from metadata associated with the encoded data.

9. The method of claim 1, further comprising, after decoding a last symbol from the encoded data, skipping dynamically determining a current number of bits to be recovered from the encoded data and a new state X.

10. The method of claim 1, wherein the numbers of occurrences for the distinct symbols are reduced numbers of occurrences instead of actual numbers of occurrences.

11. A decompressor, comprising:
   an un-packer configured to receive encoded data to be decompressed and obtain a size "$S_{total}$" of a total number of symbols in the encoded data, numbers of occurrences for distinct symbols in the encoded data, and a final state generated during an encoding process as a first state for decoding;
   a decoding table constructor configured to build a decoding table containing a row of the distinct symbols corresponding to L encoding states, a row of substitutes for numbers of bits to be recovered corresponding to the L encoding states and a row of substitutes for new states corresponding to the L encoding states, wherein L is equal to a sum of the numbers of occurrences for the distinct symbols;
   a decoding table storage to store the decoding table; and
   a decoding engine configured to decode the encoded data using the decoding table including:
      obtain a current symbol from the decoding table based on a current state X;
      dynamically determine a current number of bits to be recovered from the encoded data and a new state X based on a corresponding substitute for number of bits to be recovered and a corresponding substitute for a new state from the decoding table for the current state X; and
      output symbols recovered from the encoded data.

12. The decompressor of claim 11, wherein the L encoding states are a range of L distinct values M to M+L−1 with M being a base value for the range and an integer equal to or larger than zero.

13. The decompressor of claim 11, wherein L is not power of 2 and M is zero, and to build the decoding table comprises:
   set an initial value X to zero and R to ceiling(lg(L)), wherein ceiling( ) is a ceiling function and lg( ) is a binary logarithm function;
   in an outer loop with a loop index corresponding to positions of each element in a set of the distinct symbols:
      set an initial value of $L_s$ to a number of occurrences for a current symbol;
      in an inner loop to go through all number of occurrences for the current symbol:
         set a current entry for the row of distinct symbols to the current symbol;
         for an index "j" from 0 to R:
            obtain a temporary $L_s$ $L_{s\_tmp}$ as $(L_s<<j)+(2^j-1)$ until $L_{s\_tmp}$ falls into an interval $\{L, \ldots, 2L-1)$, wherein "<<" is a left shift operator, "^" is an exponentiation operator, and
            set a current corresponding substitute for a number of bits to be recovered to "j";
            break out from the loop with "j" as the index;
         set a current corresponding substitute for a new state to Ls;
         increment X by one;
         increment Ls by one;
      end the inner loop; and
   end the outer loop.

14. The decompressor of claim 13, wherein an operation for $(L_s<<j)+(2^j-1)$ is performed by shifting $L_s$ "j" bits left and inserting "j" bits 1 at the least significant bit (LSB).

15. The decompressor of claim 12, wherein L is not power of 2 and M is zero, and to dynamically determine the current number of bits to be recovered from the encoded data and the new state X based on the corresponding substitute for number of bits to be recovered and the corresponding substitute for the new state from the decoding table for the current state X comprises, with the corresponding substitute for number of bits to be recovered named as n_Bits and the corresponding substitute for the new state named as new_state:
   take n_Bits bits and n_Bits+1 bits from the encoded data, append them to the new_state and subtract L from the new_state respectively; and
   determine the current number of bits to be recovered from the encoded data as n_Bits bits or n_Bits+1 bits by which one of them makes their respectively appended new_state falling into the range of L distinct values.

16. The decompressor of claim 15, wherein operations to obtain the current number of bits to be recovered from the encoded data and the new state X include:

setting X1 to [(new_state)<<n_Bits]−L+(n_Bits of the encoded data);

setting X2 to [(new_state)<<(n_Bits+1)]−L+[(n_Bits+1) of the encoded data];

determining which of X1 and X2 falls into a range of {0, . . . , L−1};

setting the current number of bits to be recovered from the encoded data as n_Bits and the new state X to X1 if X1 falls into the range of {0, . . . , L−1}; and setting the current number of bits to be recovered from the encoded data as n_Bits+1 and the new state X to X2 if X2 falls into the range of {0, . . . , L−1}.

17. The decompressor of claim 11, wherein the un-packer is further configured to obtain a bit order and a concatenation order, the bit order specifying an order of bits when the encoded data is generated and the concatenation order specifying an order for sets of bits generated from consecutive symbols being concatenated together when the encoded data is generated.

18. The decompressor of claim 11, wherein the un-packer is further configured to obtain the number L from metadata associated with the encoded data.

19. The decompressor of claim 11, wherein the decoding engine is further configured to, after decoding a last symbol from the encoded data, skip dynamically determining a current number of bits to be recovered from the encoded data and a new state X.

20. The decompressor of claim 11, wherein the numbers of occurrences for the distinct symbols are reduced numbers of occurrences instead of actual numbers of occurrences.

\* \* \* \* \*